United States Patent [19] [11] Patent Number: 5,122,929
Palanisamy et al. [45] Date of Patent: Jun. 16, 1992

[54] METHOD OF ACHIEVING SELECTIVE INHIBITION AND CONTROL OF ADHESION IN THICK-FILM CONDUCTORS

[75] Inventors: Ponnusamy Palanisamy, Kokomo; Dwadasi H. R. Sarma, West Lafayette; John A. Hearn; Dwight L. Schwarz, both of Kokomo, all of Ind.

[73] Assignee: Delco Electronics Corporation, Kokomo, Ind.

[21] Appl. No.: 297,201

[22] Filed: Jan. 17, 1989

Related U.S. Application Data

[63] Continuation-in-part of Ser. No. 232,743, Aug. 16, 1988, abandoned, and a continuation-in-part of Ser. No. 232,744, Aug. 16, 1988, abandoned.

[51] Int. Cl.$^5$ .............................................. H05K 1/02
[52] U.S. Cl. ..................................... 361/400; 361/411; 361/406; 501/32; 427/96; 174/260
[58] Field of Search ............... 361/404, 400, 406, 411; 174/266, 261; 501/15, 18, 32; 427/96

[56] References Cited

U.S. PATENT DOCUMENTS

| | | | |
|---|---|---|---|
| 4,517,155 | 5/1985 | Prakash et al. | 419/19 |
| 4,728,751 | 3/1988 | Canestaro et al. | 361/404 X |
| 4,733,018 | 3/1988 | Prabhu et al. | 361/411 X |
| 4,816,615 | 3/1989 | Prabhu et al. | 174/68 |
| 4,830,878 | 5/1989 | Kaneko et al. | 427/96 |
| 4,940,849 | 7/1990 | Morris et al. | 428/209 |

FOREIGN PATENT DOCUMENTS

| | | |
|---|---|---|
| 0044246 | 1/1982 | European Pat. Off. . |
| 0075890 | 4/1983 | European Pat. Off. . |
| 0245697 | 11/1987 | European Pat. Off. . |
| 0263277 | 4/1988 | European Pat. Off. . |
| 2479639 | 10/1981 | France . |

OTHER PUBLICATIONS

European Search Report on European Patent Application EP 89 30 6821 dated 7 Jun. 1991.
Annex to the European Search Report on European Patent Application No. EP 89 30 6821 dated Jun. 7, 1991.

*Primary Examiner*—Leo P. Picard
*Assistant Examiner*—P. Ghosh
*Attorney, Agent, or Firm*—Gary W. Brooks

[57] ABSTRACT

A technique for providing controlled adhesion of a portion of a printed conductor to a circuit board employs an inhibitor layer between the circuit board and the portion of the printed conductor where such controlled adhesion is desired. The inhibitor layer is formed using a mixture of finely divided alumina powder and a glass frit, which are both suspended in an organic screening agent. An electrical module connected between controllably adherent conductor portions is thereby able to move to relative mechanical stresses.

40 Claims, 11 Drawing Sheets

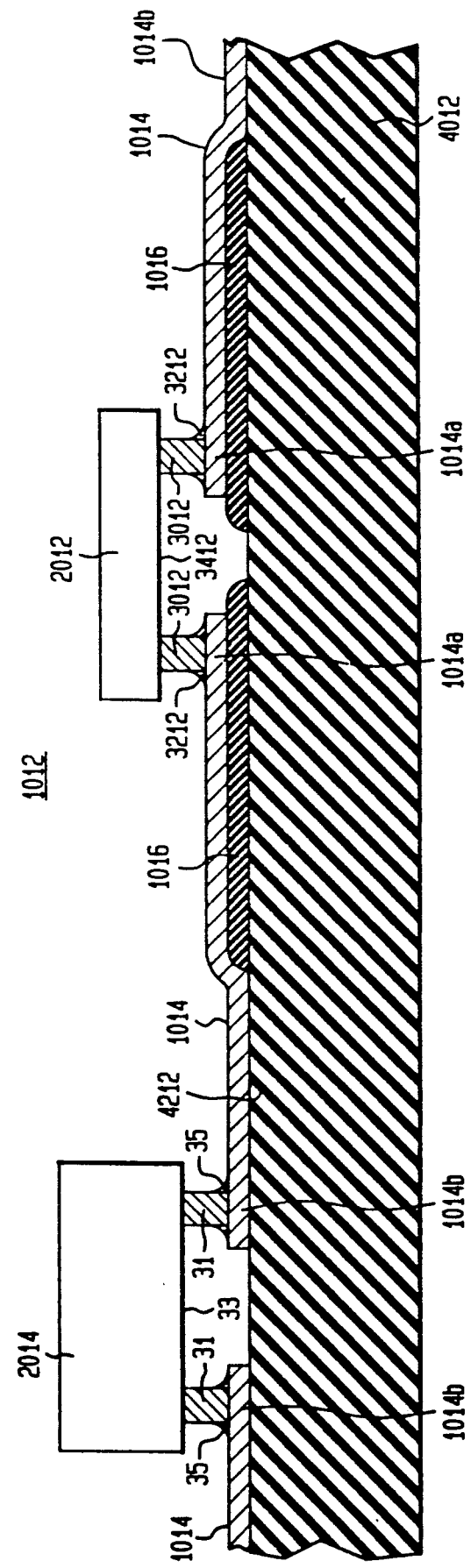

METHOD OF ACHIEVING SELECTIVE INHIBITION AND CONTROL OF ADHESION IN THICK-FILM CONDUCTORS

CROSS REFERENCE

This is a continuation-in-part of our copending patent applications, Ser. Nos. 232,743 abandoned and 232,744, both filed Aug. 16, 1988 abandoned, and both having a common assignee and inventorship, and is related to two continuation-in-part patent applications of the same copending patent applications which are being filed concurrently with this application and have the same assignee and inventorship.

FIELD OF THE INVENTION

This invention relates to compositions of matter that are useful in forming conductive patterns on an insulating substrate, techniques for forming such patterns, and assemblies using such a substrate. One such substrate is a circuit board having conductors which connect an electrical module to the circuit board to form a printed circuit board assembly.

BACKGROUND OF THE INVENTION

As used herein, the term "electrical module" is intended to include any component, such as a semiconductor chip, a light emitting or detecting device, an emitting or detecting device of magnetic nature, a magnetic storage device, a capacitor, an inductor, a resistor, a crystal, a coil, a varactor, a thermistor, a resonator, transformers, and/or a connector that may be connected in an electrical circuit, an electro-optical circuit, an optical configuration, an electro-magnetic circuit and/or a magnetic configuration. The term "printed circuit board" is intended to encompass a support member that may be rigid or flexible, laminated or not, of any suitable composition, and that includes an electrically insulative surface on which a printed pattern of electrical conductors is provided. The term "printed pattern" is intended to encompass a pattern on a substrate formed by any suitable process, including, but not limited to, silk screen printing, photolithography, evaporation, plating, stenciling, ink writing, plasma deposition, sputtering, adhesives, or thin film or thick film techniques.

A printed circuit board having a semiconductor chip or other electrical module attached thereto shall be denoted as a printed circuit board assembly. It will be convenient to generally discuss the invention with particular reference to a printed circuit board assembly including a semiconductor chip of the surface mount or flip-chip type.

Such a chip typically has formed thereon an integrated circuit containing a number of electrical contacts (terminals) on one surface. The contacts are typically soldered or otherwise electrically connected to the conductors of the printed circuit board.

In the past, much effort has been focused on the use of conductors that are firmly adherent to the printed circuit board to minimize possible separation during use. Additionally, effort has also focused on maintaining the integrity of the conductor-chip interface to prevent failure at that connection. This arrangement usually operates satisfactorily. However, there are hostile environments, usually of high temperature and thermal excursions, where, during use, severe stresses cause the chip to separate from the printed circuit at or near the points of connections, i.e., the solder joints. Such stresses can occur, for example, when the printed circuit board is used in an automobile.

It is desirable to have conductors of compositions which result in a printed circuit board assembly in which the electrical modules remain reliably connected to the printed conductors in hostile environments.

SUMMARY OF THE INVENTION

In a copending application, Ser. No. 232,743, filed Aug. 16, 1988, and in a continuation-in-part patent application thereof which is being filed concurrently with the present patent application, there is described and claimed a printed circuit board assembly which employs controllably adherent conductors that are connected at one end to a contact area of an electrical module and at the other end to a contact portion of a firmly adherent conductor on the circuit board (substrate). The term "controllably adherent conductor" is used to describe a conductor which adheres to the circuit board during the manufacturing process, but which is free when being used to move (slide) along and/or lift off from the circuit board in response to stresses that may arise, for example, from thermal effects, to relieve such stresses.

This represents an approach that is the antithesis of the conventional approach mentioned above that has focused on maintaining the conductors firmly adherent to the circuit board. However, this approach does require a conductive layer for use as the controllably adherent conductor that has a degree of cohesive strength so that it does not fracture or become mechanically weak or electrically defective when separated from the circuit board.

The present invention provides specific techniques useful for forming such controllably adherent conductors. In particular, it involves the use of a localized layer, to be termed an inhibitor layer, intermediate between a circuit board and a portion of a conductive layer to achieve controlled adhesion for such portion of the conductive layer. Such controlled adhesion describes the property of a conductive layer overlying such inhibitor layer to lift off or slide along the printed circuit board in response to appropriate mechanical stress without fracture. Moreover, it includes both the situation where the inhibitor layer remains bonded to the circuit board and separates from the overlying conductive layer and the situation where the inhibitor layer remains bonded to the conductive layer and together they separate from the circuit board.

The localized use of an inhibitor layer allows one conductive layer to have one portion used as a firmly adherent conductor by placing it in direct contact with the circuit board and to have another portion used as a controllably adherent conductor by having it overlie an inhibitor layer.

The inhibitor layer is formed preferably by printing and subsequently firing a composition comprising essentially a mixture of a finely divided refractory material (e.g., alumina or aluminum nitride) and a glass frit, suspended in an organic vehicle.

The glass frit is chosen to soften and wet both the surface of the circuit board and the refractory material at a temperature below the firing temperatures. This promotes bonding among the refractory particles and between the refractory particles and the surface of the circuit board. The refractory material chosen should have negligible chemical reaction with the conductor.

The invention will be better understood from the following more detailed description taken with the accompanying drawing.

BRIEF DESCRIPTION OF THE DRAWINGS

FIG. 12 is a cross-sectional view of a portion of a printed circuit board assembly in accordance with an embodiment of the present invention.

It is to be noted that the drawings are not to scale. Some background lines are not shown and some figures omit cross hatching to make the drawings easier to understand.

DESCRIPTION OF THE INVENTION

Figure 1:
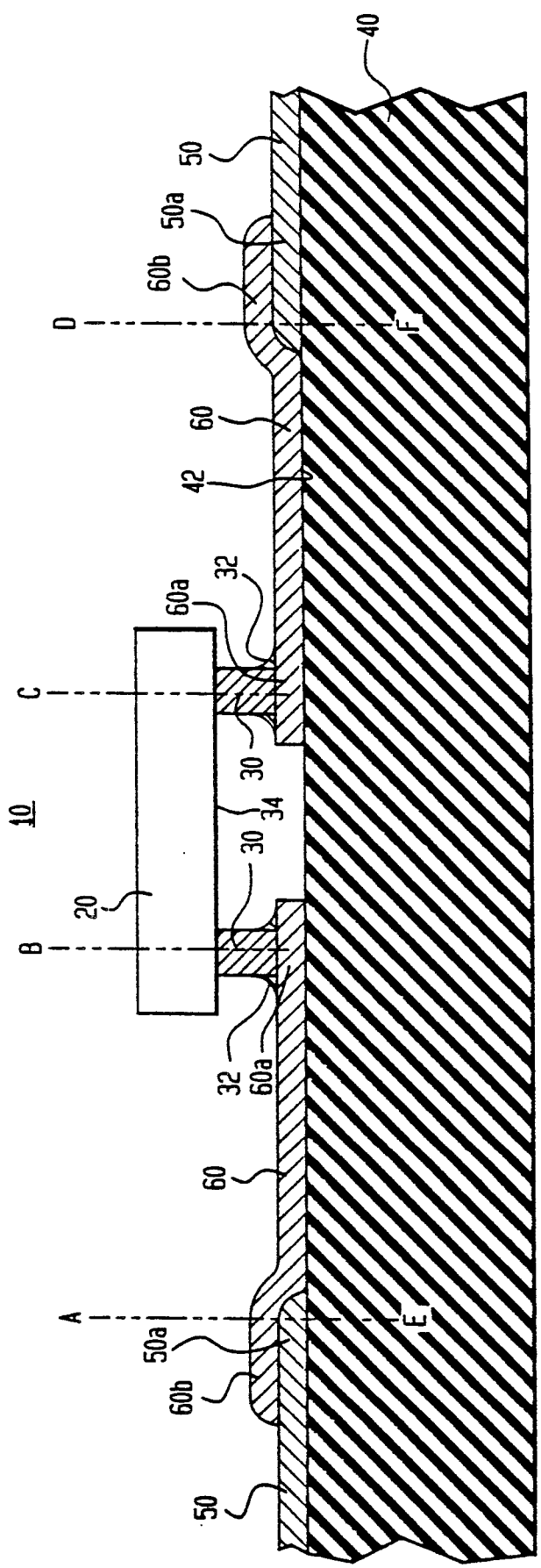
FIG. 1 is a cross-sectional view of a portion of a printed circuit board assembly, as shown in the parent patent applications.

Referring now to FIG. 1, there is shown a cross-sectional view of a portion of a printed circuit board assembly 10 shown in the previously mentioned parent patent applications. The assembly 10 comprises an electrical module 20 and a support member (circuit board, substrate) 40 having an insulative top surface 42 on which are printed firmly adherent conductors 50 and controllably adherent conductors 60. In a typical embodiment, the module 20 comprises an integrated circuit formed in a silicon chip of the flip chip or surface mount type, suitably covered by an insulating material (not shown) and having a plurality of external contacts 30 (e.g., silver bumps) on a lower surface 34 thereof. These contacts 30 are connected to electrodes not shown) of various circuit elements (not shown) of the module 20. The electrical module 20 may take various other forms as previously mentioned. It is to be noted that for illustrative purposes only, one module 20 is shown. Typically, a printed circuit board assembly contains a plurality of modules 20 of different types.

Substrate 40 is of a suitable insulating material, such as alumina ($Al_2O_3$). The conductive pattern formed by the conductors 50 and 60 and the module 20 form an electrical circuit of the printed circuit board assembly 10. The firmly adherent conductors 50 may be conventional. They are typically formed by depositing a patterned layer of a suitable ink or paste that, after firing, provides a firmly adherent conductive pattern that is compatible for use with a pattern of controllably adherent conductors 60. Such a firmly adherent conductor may include copper, nickel, silver, palladium, platinum and gold and/or alloys thereof and/or other suitable metals and/or compounds to make it conductive.

The module 20 is secured to the highly adherent conductors 50 by way of controllably adherent conductors 60. Each contact 30 of module 20 is typically connected to one end 60a of a controllably adherent conductor 60 by means of a bond, such as a solder joint 32. The nature of these conductors 60 will be discussed more fully below. The bond could be formed in various other ways, including use of a conductive adhesive epoxy or other conductive adhesive material, or the bond could be a weld. The other end 60b of the controllably adherent conductor 60 is bonded or fused in any suitable fashion to a contact portion 50a, typically formed by an end of a firmly adherent conductor 50. All but the latter end 60b of each conductor 60 is controllably adherent to the surface 42 so that it can flex and lift off the surface 42 to relieve stresses on solder joints 32. Moreover, because the contacts 30 of the module 20 are bound only to the ends 60a of conductors 60, and the module 20 is not itself bonded to surface 42, the module 20 can also move along or lift off the surface 42 of the substrate 40 to help relieve stresses at the joints 32. As a result, pulling apart forces are significantly reduced at each solder joint 32. The stresses that occur may produce either tensile or compressive stresses that are substantially completely absorbed due to the flexible nature in which module 20 is mounted to provide a substantially stress-free and fatigue-free system.

Moreover, as will be discussed more fully later, because the controllably adherent conductors 60 are free to move, it is feasible to design the lengths of the conductors 60 so that their changes in length relative to the changes in the lengths of the relevant portion of the alumina substrate 40 and of the electrical module 20 balance over an operating temperature range to further relieve stresses in the solder joints 32.

Figure 8:
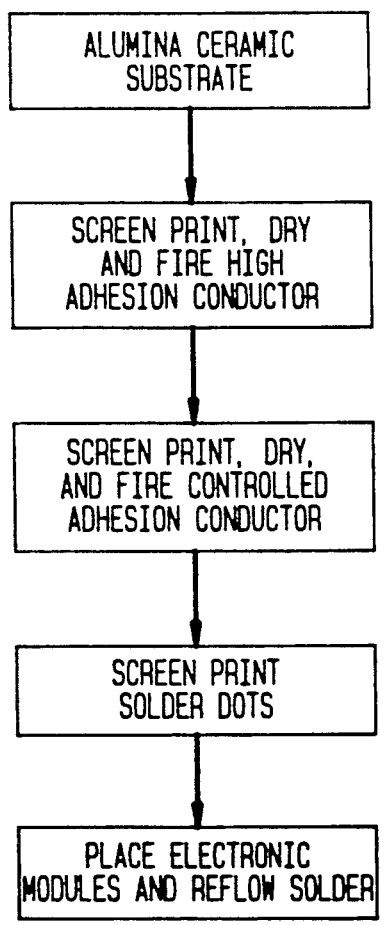
FIG. 8 is a flow chart of a typical process used to form the assemblies shown in FIGS. 1, 4, 5, 6, 7 and 9.

Referring now to FIG. 8, there is shown a flow chart of a typical process for preparing the assembly 10 shown in FIG. 1. As indicated, a ceramic printed circuit board, typically of alumina, is used as the substrate 40.

Firmly adherent conductors 50 are then deposited on the substrate 40. This is done in conventional fashion and generally involves first screen printing a suitably patterned layer and then drying and firing the layer. The layer as printed, is of an ink or paste that will form a firmly adhering conductive layer. In a preferred embodiment, the layer deposited is of a material commercially available from Dupont Electronics and known as Dupont 9161. It basically comprises conductive copper particles, adhesion promoters and a screening agent. Suitable other materials are available from other sources. After printing, the drying and firing is done in the manner prescribed by the supplier to sinter the copper particles together into a conductive layer 50 which firmly adheres to the substrate 40.

Figure 10:
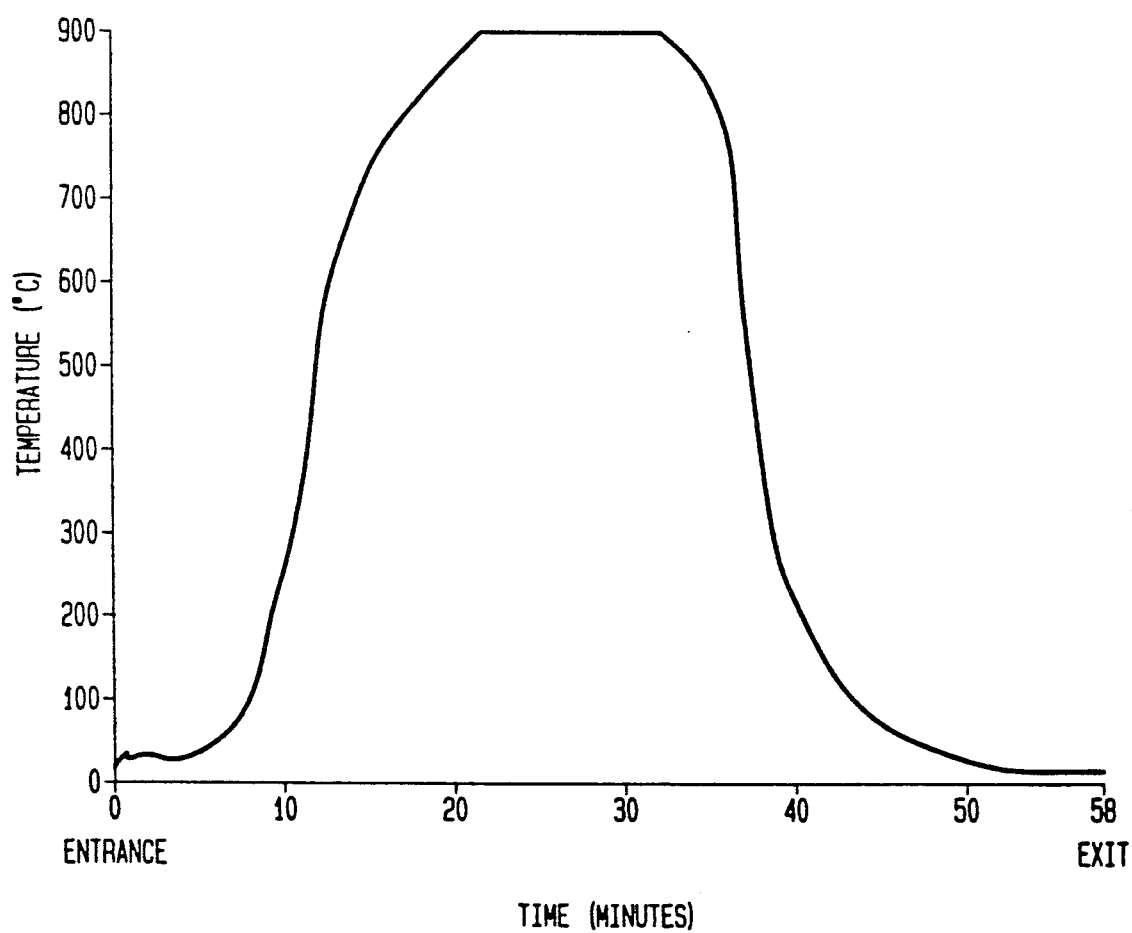
FIG. 10 is a graphical plot of the parameters of a furnace useful in forming the conductors on the printed circuit board assemblies of the above described figures.

Referring now to FIG. 10, there is shown a graphical plot of the parameters of a furnace (not shown) that can be used for the firing process. In the plot, the y axis shows temperature in degrees C of successive zones of the furnace and the x axis shows elapsed time in minutes as a workpiece (e.g., a circuit board 40 with ink patterns which will become conductors 50 and/or 60) moves along a belt (not shown) through the various temperature zones existing within the furnace. The terms "ENTRANCE" and "EXIT" shown in FIG. 10 indicate the workpiece entering and exiting, respectively, the furnace. As is seen, the workpiece takes slightly more than twenty minutes to reach the maximum temperature of about 900° C. during which time the organic vehicle in the original paste or ink is being removed. It then takes about ten minutes to pass through the furnace zone at this peak temperature during which the copper particles are sintered into a conductive layer. Finally, it is allowed to cool gradually to room temperature over about a twenty minute period to reduce thermal shock. Of course, the optimum parameters are usually a function of the particular paste or ink being used.

Next, the controllably adherent conductors 60 are similarly formed by screen printing, drying and firing a layer of suitable composition.

To avoid the need for separate furnaces, it is advantageous to choose compositions for use in forming both the firmly adherent conductors 50 and the controllably adherent conductors 60 that can be processed in the same way. When this is done, the drying and firing of the composition used to form conductors 60 are carried out in the same manner as described previously for the conductors 50 as discussed with reference to FIG. 10. The conductors 60 are formed to extend between the firmly adherent conductors 50 and where the contacts 30 of the modules 20 are to be positioned.

Special compositions are used to form conductors 60 to provide the desired controllable adherent properties and to be compatible for use with conductors 50.

Several compositions are presently of particular interest for use to form controllably adherent conductors 60 of the kind described. These compositions have the advantage that they have the desired compatibility with conductors 50.

The first composition, which is preferred for some applications, includes by weight about 88.5 percent of a conductor, about 10 percent of a suitable screening agent, and about 1.5 percent of a binder. The conductor is finely divided copper powder with an average particle size of between 1 and 2 microns. The specific screening agent is a mixture of about 90 percent by weight of a solvent, typically Texanol TM (believed to be 2,2,4 Trimethyl 1,3 Pentanedio Monoisobutyrate), and the remainder of a resin, typically ethyl cellulose grade N-50, both of which are available commercially. The binder consists essentially of bismuth oxide ($Bi_2O_3$) which promote both adhesion of the layer 60 to the substrate 40 during processing and cohesion of the copper particles after firing.

Too large an amount of the binder undesirably increases adhesion to the substrate 40 and makes it difficult for the controllably adherent conductors 60 to lift off the surface 42 of the substrate 40 to accommodate mechanical stresses. Too little of the binder results in nonadherence immediately after firing, preventing any subsequent processing. Typically, the binder should be at least 0.05 percent and no more than 5.0 percent of the composition, although if the binder is chosen to be one largely lost during firing, or is not a very effective adhesion promoter, larger amounts initially may be feasible. The appropriate limits can be expected to be dependent on the characteristics of the metal powder employed.

The screening agent should be chosen to facilitate the screen printing and various other agents should be suitable. Moreover, the fraction of the solvent in the screening agent typically is between 85 and 98 percent.

A second composition, which is also found particularly useful, differs only in the composition of the binder, which now consists essentially of equal parts by weight of bismuth oxide and cuprous oxide, milled together. Here the cuprous oxide appears to serve primarily to promote adhesion.

Another composition that proved useful included by weight about 89 percent powdered copper, about one percent a frit as the binder, and about 10 percent of the screening agent described above in which the frit included by weight about 70.0 percent bismuth oxide ($Bi_2O_3$), 15.6 percent lead oxide (PbO), 4.5 percent lead fluoride ($PbF_2$), 6.6 percent silicon dioxide ($SiO_2$), 0.6 percent aluminum oxide ($Al_2O_3$), and 2.7 percent boron oxide ($B_2O_3$).

The components of this frit by weight could be varied with the $Bi_2O_3$ between 0–73 percent, the PbO between 15–60 percent, the $PbF_2$ between 4–12 percent, the $SiO_2$ between 5–25 percent and the $Al_2O_3$ between 0.5–2.5 percent and the $B_2O_3$ between 2–10 percent. This frit can be also viewed as a mixture of bismuth oxide (0–70 percent) and the remainder a frit of the following composition by weight, 50–65 percent PbO, 5–15 percent $PbF_2$, 20–30 percent $SiO_2$, 0–5 percent $Al_2O_3$ and 5–15 percent $B_2O_3$ with a typical composition of this frit being by weight 55.4 percent PbO, 9.4 percent $PbF_2$, 23.5 percent $SiO_2$, 2.1 percent $Al_2O_3$ and 9.6 percent $B_2O_3$.

Two other compositions that proved successful included by weight 89.25 and 89.5 percent copper powder, respectively, 10 percent of the screening agent described earlier and the balance a frit that included by weight 60–75 percent PbO, 10–25 percent $SiO_2$, 5–30 percent $B_2O_3$ and 0–10 percent $Al_2O_3$. One embodiment which proved successful included a glass frit approximately by weight 66.6 percent PbO, 22.4 percent $SiO_2$, 8.7 percent $B_2O_3$ and 2.3 percent $Al_2O_3$.

These examples demonstrate the wide range of mixtures that can be used as the binder in the compositions to achieve the controllably adherent conductor needed.

In general, the compositions especially useful for forming controllably adherent conductors 60 comprise between 75 and 92 percent finely divided copper powder, with an average particle size of between about 0.5 and 5.0 microns, 7.5 to 20 percent of a screening agent, and the remainder essentially of a binder to promote adequate cohesion and controllable adhesion of the kind described. In a preferred range, the copper has an average particle size between 1 and 2 microns and comprises between 85 and 90 percent of the mixture.

A variety of other compositions should be suitable including some that use other kinds of conductive particles, such as silver, palladium, nickel, platinum and gold and/or alloys thereof. Moreover, in some instances, it may prove advantageous to include a surfactant to improve wetting. The composition should result in controllably adherent conductive layers having characteristics compatible with those of the firmly adherent conductive layers.

Next, optionally there may be printed, dried and fired other layers that serve special roles, such as thick film resistors. In some instances, in order to provide different values of thick film resistors, two or more resistive compositions are included that require separate processing. This step may be repeated as needed to deposit all such thick film resistors.

Finally, as indicated, the electrical module 20 of the assembly 10 is electrically connected to the controllably adherent conductors 60.

Typically, this first includes printing solder dots on the ends 60a of conductors 60 where such ends 60a are to be attached to the contacts 30 of the module 20. This can be done in conventional fashion. Advantageously, the solder paste used to form the dots comprises a 25/75 tin-lead solder. After the solder paste is deposited, the electrical module 20 is appropriately positioned to have its contacts 30 aligned with the solder dots. Then the assembly 10 is heated to a temperature to melt and reflow the solder and then cooled to solidify resulting solder joints 32 between the contacts 30 and the ends 60a of conductors 60.

It should be apparent that it would be feasible, if desired, to print or form the controllably adherent conductors 60 before printing or forming the firmly adherent conductors 50.

In some instances, it may be feasible to use a single furnace operation to form both patterns of conductors simultaneously.

When the assembly 10 thus prepared is placed in operation and subjected to sufficiently high stresses, these stresses are absorbed by the conductors 60, which lose their adhesion to the substrate 40 and then are free to move along and/or lift off the surface 42 of the substrate 40.

In an embodiment of assembly 10 in accordance with the invention: the contacts 30 of module 20 are made of silver and each has a height in the range of 0.0007" to 0.003" and a diameter of about 0.006"; the module 20 is square in shape and has dimensions in the range of 0.180" to 0.3"; and the solder joints 32 are formed using a 25/75 tin lead solder; each of conductors 60 has a width of 0.005" to 0.01", a length of 0.04" to 0.150" and a thickness of 0.0003" to 0.0008". Various other parameters, such as the thickness of conductors 60 in the range of 0.0003 to 0.001 inches, are, of course, feasible.

The dimensions of the conductors 60 advantageously are designed to provide optimal performance of their function with a minimal amount of conductor material. Various conductor configurations are feasible and typical configurations are described below.

Referring again to FIG. 1, in one presently preferred design, the thermal expansion rate (change in length/unit change in temperature) of dimension A to D along the conductors 60 and the module (chip) 20 is equal to that of the dimension of E to F along the substrate 40. The rate of expansion is determined by the thermal expansion coefficient of the type of material and the length of material that is of concern. Thus, if the rate of expansion of distance A to B, B to C and C to D are added, they become that of A to D, which should be equal to the rate of expansion of E to F. For a given assembly 10, the dimension B to C is fixed by the chip 20 design. However, the dimensions A to B and C to D can be made of any desirable length. By adjusting the length of A to B and C to D (normally these would be equal), the sums of the rates of all three components can be made equal to that of E to F. One assembly 10, which was built on an alumina substrate 40, had a length (A to B)=(C to D)=0.44 inches and used a module 20 having a square dimension of 0.284" (B to C).

The controllably adherent conductors may be formed in various shapes as desired, since the shape, while important, is not critical.

Figure 2:
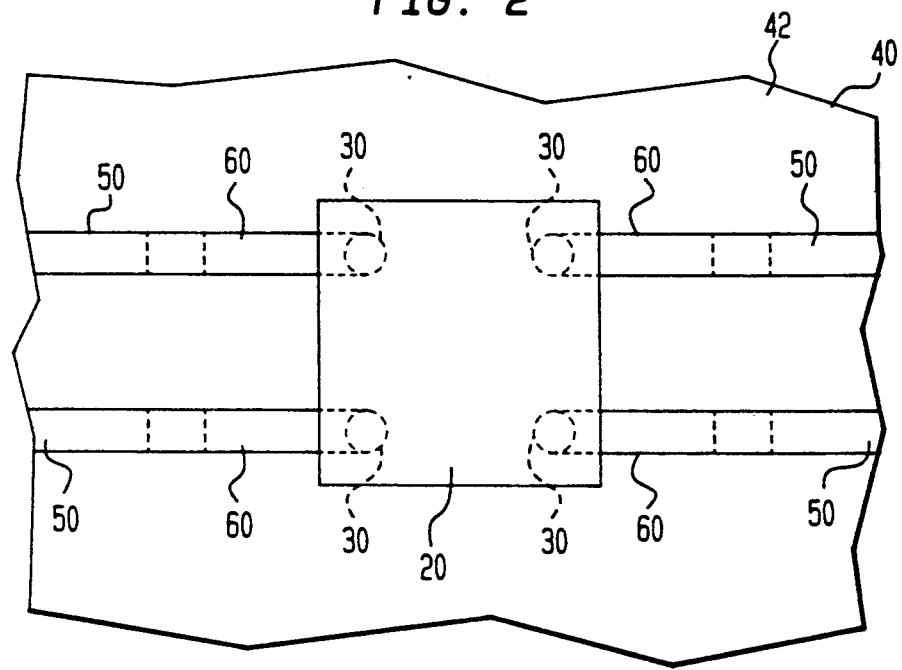
FIG. 2 is a top view of a portion of the assembly shown in FIG. 1.

Referring now to FIG. 2, there is shown a top view of a portion of assembly 10 which shows the controllably adherent conductors 60 as straight.

Figure 3:
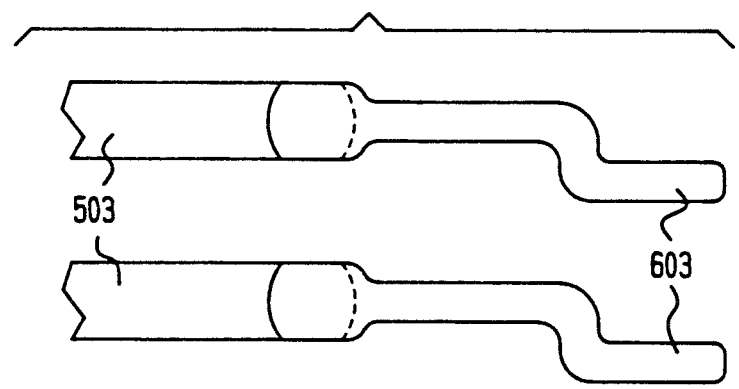
FIG. 3 is a top view of a modification of controlled adhesion conductors of the assembly of FIG. 1.

Referring now to FIG. 3, there is shown a top view of controllably adherent conductors 603 which have an S-shaped bend to reduce stress at the joint between a conductor 603 and a firmly adherent conductor 503. Conductors 503 and 603 are the same kind of conductors as conductors 50 and 60, of FIG. 1 except for the bend in each conductor 603.

Figure 4:
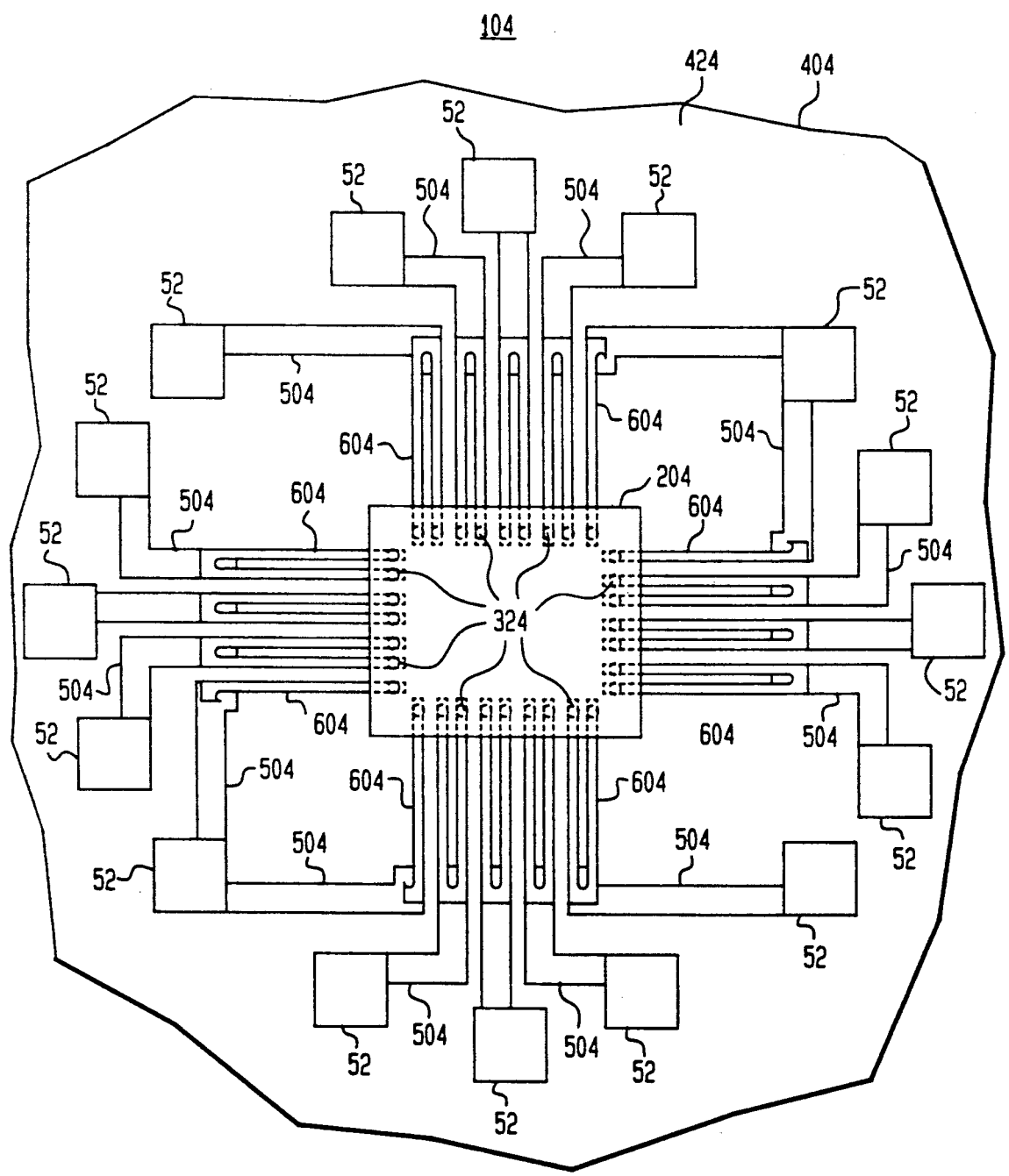
FIG. 4 is a top view of another printed circuit board assembly shown in the parent patent applications.

Referring now to FIG. 4, there is shown a top view of a printed circuit board assembly 104. Assembly 104 is similar to assembly 10 of FIG. 1, and all corresponding parts thereof have the same reference number with a "4" added thereafter. One end of each of firmly adherent conductors 504 mechanically and electrically contacts a bonding (contact) pad 52 which firmly adheres to surface 424 of substrate 404. Controllably adherent conductors 604 are straight. Each of conductors 604 is shown having two parallel fingers. This configuration is useful for testing, but a single finger conductor 604 is typically preferable. It is to be noted that the conductors 504 can be eliminated with conductors 604 then being connected directly to pads 52. Still further, pads 52 can be modified in shape and size and brought out to an edge of substrate 404 to serve as the male portion of a connector assembly (not shown) that is adapted to plug into a female portion (not shown) of the connector assembly.

Figure 5:
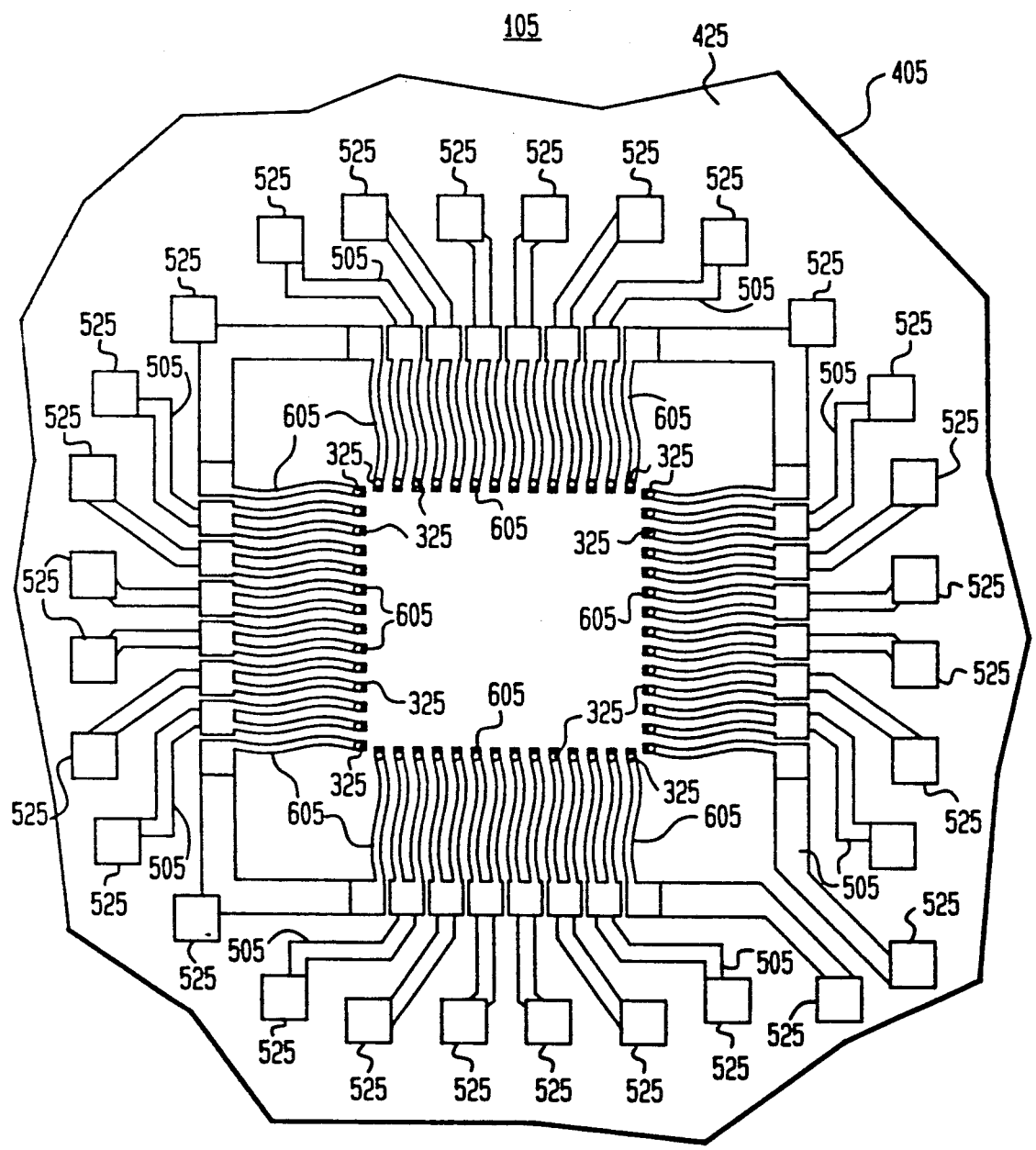
FIG. 5 is a top view of another printed circuit board assembly shown in the parent patent applications.

Referring now to FIG. 5, there is shown a top view of a printed circuit board assembly 105. Assembly 105 is similar to assembly 10 in FIG. 1 and all corresponding parts thereof have the same reference number with a "5" added thereafter. Assembly 105 is also similar to assembly 104 of FIG. 4 except that controllably adherent conductors 605 are S-shaped and are connected to firmly adherent conductors 505 which are connected to bonding (contact) pads 525. A module 205 to which conductors 605 are connected is not shown.

Figure 6:
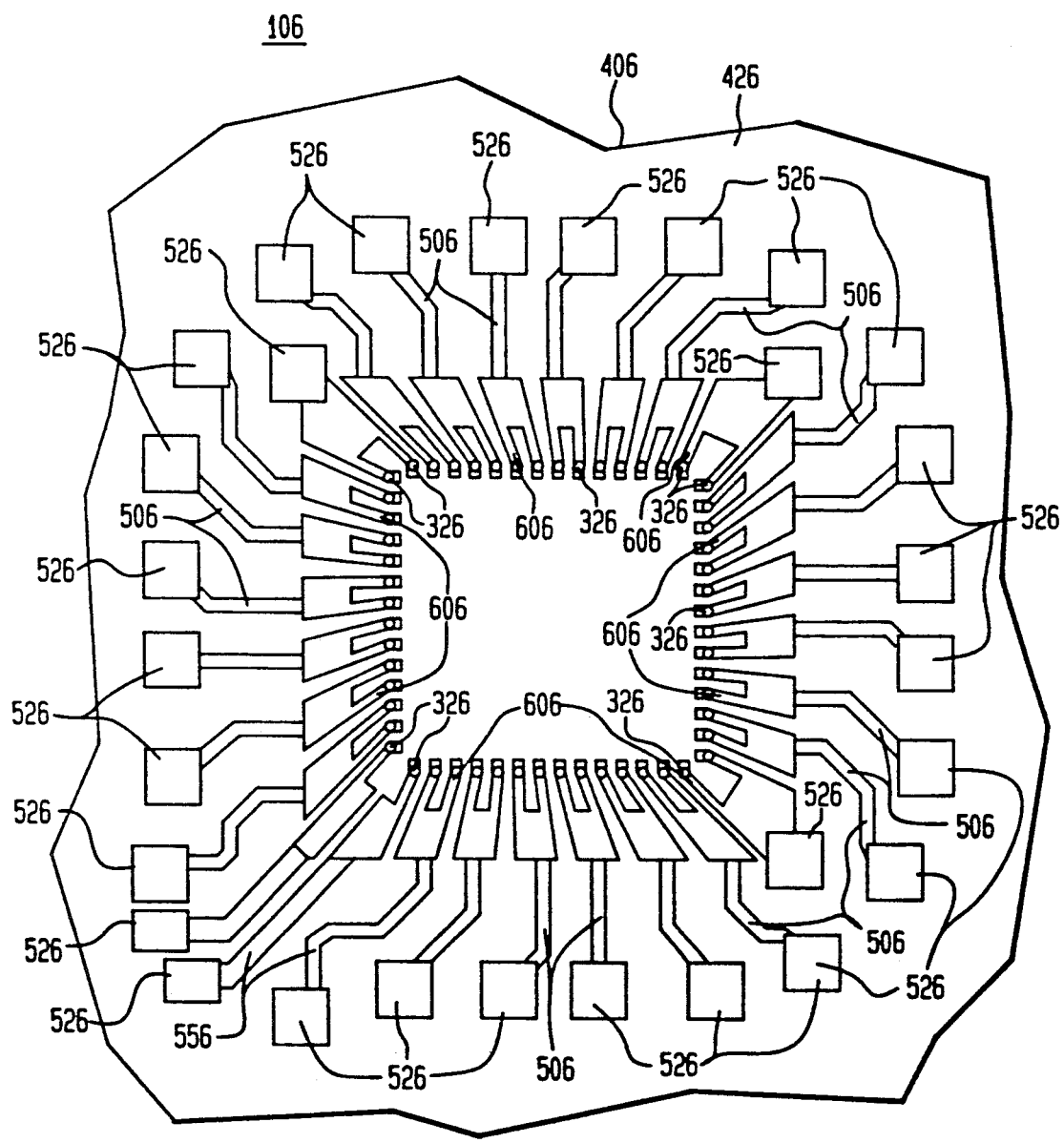
FIG. 6 is a top view of another printed circuit board assembly shown in the parent patent applications.

Referring now to FIG. 6, there is shown a top view of a printed circuit board assembly 106. Assembly 106 is similar to assembly 10 of FIG. 1 and all corresponding parts thereof have the same reference number with a "6" added thereafter. Assembly 106 is also similar to assembly 105 of FIG. 5 except that the controllably adherent conductors 606 are angled with respect to the module (chip) 206 (not shown) they contact. Printed circuit board assembly 106 allows the chip to rotate so as to relieve stress where the chip is soldered to conductors 606.

Figure 7:
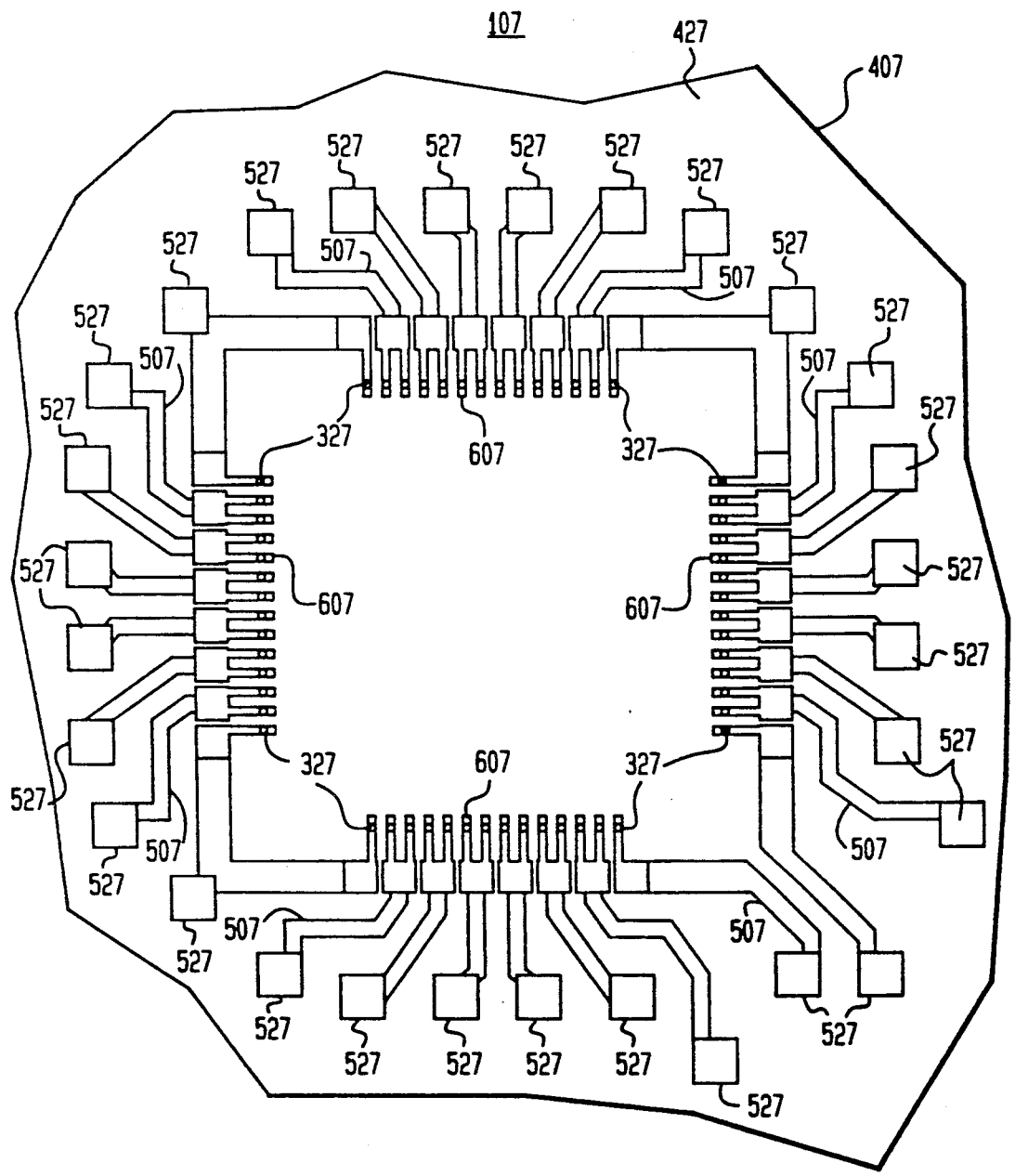
FIG. 7 is a top view of another printed circuit board assembly shown in the parent patent applications.

Referring now to FIG. 7, there is shown a top view of a printed circuit assembly 107. Assembly 107 is very similar to assembly 10 of FIG. 1 and to assembly 104 of FIG. 4 except the corresponding parts thereof have a "7" added to the last digit of the reference number. In this case, there is no provision for the rotation of the module (chip) 207 (not shown) to accommodate movement in the positions of its contacts 307 (not shown) and the joints 327 (not shown). Instead, the length of the pairs of conductors 607 are chosen so that over a preselected operating temperature range, the changes in position of their first ends are such as to compensate for the changes in position of the module contacts 307 (not shown). As a result, stresses on the solder joints 327 are significantly limited and the reliability of assembly 107 is significantly increased.

It should be apparent that the invention is largely independent of the specific nature of the electrical module connected into the printed circuit. It could be simply any circuit component as listed above that has contacts on one surface by which the circuit component is to be connected. It may also be a connector whose various pins are to be connected to ends of the controllably adherent conductors.

Additionally, as was mentioned earlier, the term "printed circuit board" can encompass a wide variety of forms since the nature of the substrate on which the controllably adherent conductors are deposited need only be compatible with the desired controllable adhesion of the conductive layer deposited.

In particular, the substrate or support member may even be a semiconductor wafer on which are deposited controllably adherent conductors for connecting components therein. Additionally, the substrate or support member may be a first semiconductor chip on top of which is connected a second semiconductor chip by way of controllably adherent conductors which are free to move on and/or away from a surface of the first chip.

Moreover, the invention may be feasible with superconductive circuits in which either the controllably adherent or firmly adherent conductors are superconductors.

Similarly, it should be apparent that the specific nature of the circuit board that serves as the substrate or support member is not critical. In particular, the circuit board need not be rigid but may be of a flexible kind. Also, it need not be ceramic but may be of any suitable composition that is compatible with controlled adhesion.

In some instances, it may prove desirable to provide a resilient coating over the surface of the electrical module including its contacts, to cushion any movement of the module. In other instances, particularly when a module is of relatively large mass, it may be desirable to restrain its movement.

Figure 9:
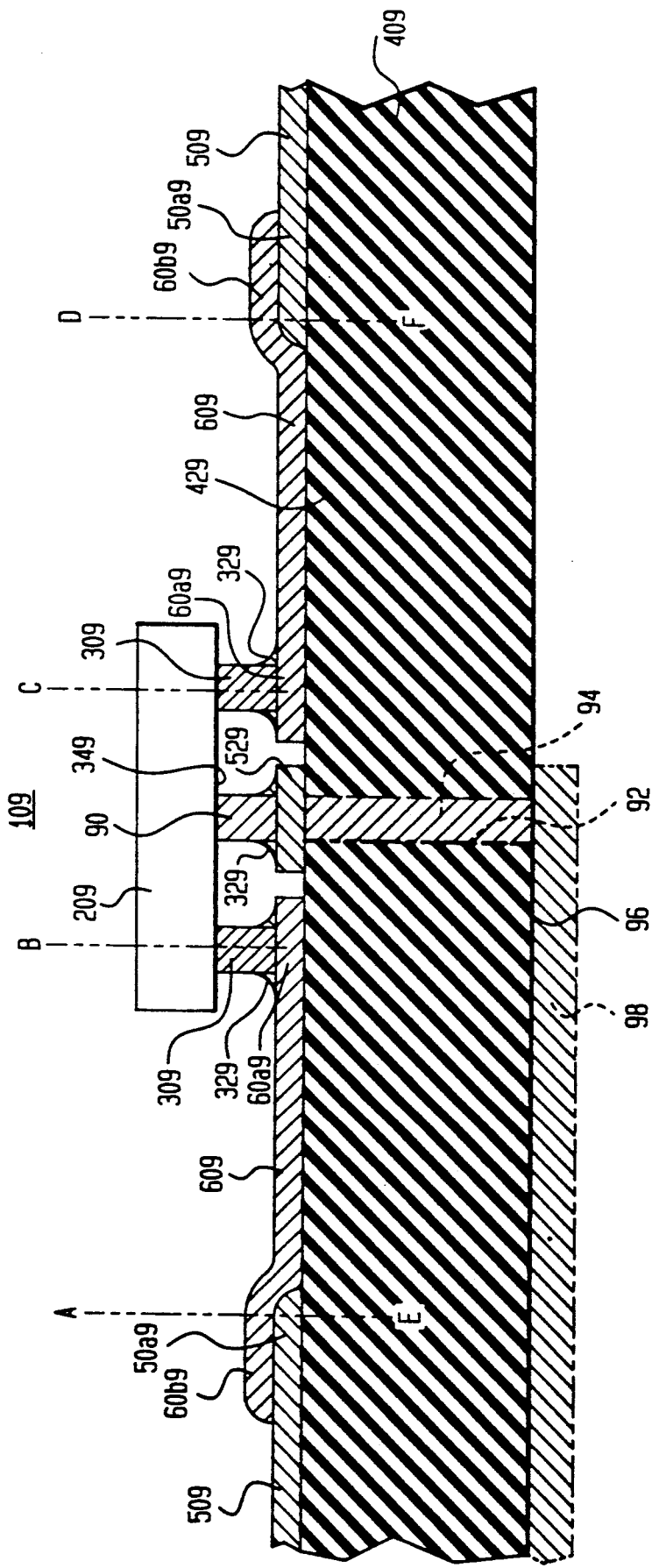
FIG. 9 is a cross-sectional view of a portion of another printed circuit board shown in the parent patent applications.

Referring now to FIG. 9, there is shown a cross-sectional view of a portion of a printed circuit board assembly 109 that is very similar to assembly 10 of FIG. 1 and the corresponding parts thereof have a "9" added to the last digit of the reference number. Assembly 109 has an electrical module 209 which has a plurality of external contacts (bumps) 309 and has an essentially centrally located contact (bump) 90 which is soldered via a solder joint 329 to a firmly adherent conductive contact region 529 on the surface 429 of the support member 409. This results in the center portion of module 209 being essentially fixed to the surface 429 of support member 409. Portions of module 209 other than the center portion thereof are free to move to relieve stress as are conductors 609.

A via 92 (shown in dashed lines) can be formed through support member 409 and a conductor 94 can be passed therethrough to an opposite surface 96 of support member 409. A firmly adherent conductor 98 (shown in dashed lines) is attached to one end of conductor 94 which has a second end attached to contact region 529. Thus support member 409 can be used as a double (two) sided printed circuit board. A central portion of support member 409, the portion shown as having contact 90, could have contact 90 deleted and could be instead adhesively attached to the surface 429 by a heat conducting and electrically non-conducting epoxy or other material or compound (all not shown) to help conduct heat away from module 209. This added heat dissipation mechanism allows for the use of larger chips with associated higher power dissipation than might be otherwise possible. In some instances the epoxy could be electrically conductive and could be used to bring electrical signals and/or power to the module 209. A plurality of contacts, each like contact 90, could be substituted for contact 90. These substituted contacts would be attached to central portions of module 90 and would serve to enhance the mechanical integrity of assembly 109 during vibration of same. The substituted contacts could also serve to bring electrical signals and/or power to module 209.

It should also be apparent that the printed circuit board may support one or more electrical modules with some free to move on the circuit board in the manner discussed and with others that are fixed in place in conventional fashion.

Figure 11:
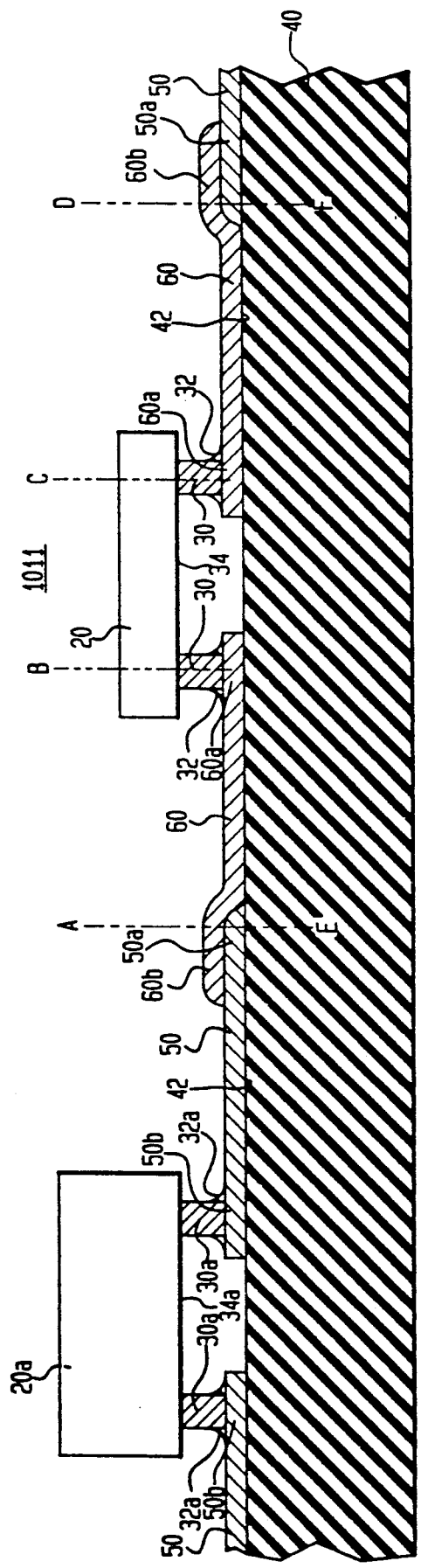
FIG. 11 is a cross-sectional view of a portion of a printed circuit board assembly shown in the previously mentioned patent applications which are being filed concurrently with the present patent application.

Referring now to FIG. 11, there is a cross sectional view of a portion of a printed circuit board assembly 1011. Assembly 1011 is essentially the same as assembly 10 of FIG. 1 except that it comprises a second electrical module 20a that is attached (soldered) via contacts (e.g., silver bumps) 30a by soldered joints 32a to portions 50b of firmly adherent conductors 50. Such attachment is typically used when module 20a is sufficiently heavy such that if it were attached to controllably adherent conductors 60 it could endanger the integrity of the controllably adherent conductors 60 and cause them to crack and/or break. The components of assembly 1011 which are very similar or identical to those of assembly 10 of FIG. 1 have the same reference number. Modules 20a advantageously are fabricated from materials which have a coefficient of thermal expansion which is close to that of support member 40 and therefore solder joints 30a will experience little stress as a result of thermal changes. Typically, thick or thin film resistors printed on a circuit board would be connected to firmly adherent conductors as would a chip that is to be wire bonded to the circuit board.

If one composition is used to form all conductors, differences in adhesion to the circuit board can be achieved by modifying portions of substrate on a microscopic scale to alter adhesion whereas other portions of the circuit board are left in the normal state. Another technique which uses one composition to form both firmly adherent and controllably adherent conductors on a common circuit board is described below.

Referring now to FIG. 12, there is shown a cross sectional view of a portion of a printed circuit board assembly 1012 in accordance with an embodiment of the present invention. The assembly 1012 comprises electrical modules 2012 and 2014 and a support member (circuit board, substrate) 4012 having an insulative top surface 4212 on which are printed (formed) conductors 1014 having portions 1014a which are separated from surface 4212 by an inhibitor layer 1016 and having portions 1014b which make direct contact with surface 4212. The portions 1014a of conductors 1014 where the inhibitor layer 1016 lies intermediate between surface 4212 and the conductive layer 1014 are controllably adherent. The portions 1014b of conductors 1014 where the conductor 1014 is in intimate contact with the surface 4212 are firmly adherent.

The electrical module 2012 has contacts 3012 thereof (which are attached to a bottom surface 3412 of module 2012) bonded, typically by solder joints 3212, to the portions 1014a of conductors 1014. As a result, the portions 1014a of conductors 1014 are controllably adherent and are able to move along and/or lift off surface 4212 of the circuit board 4012 as needed to relieve mechanical stresses on the solder joints 3212.

The electrical module 2014 has contacts 31 thereof (which are attached to a bottom surface 33 thereof) bonded, typically by solder joints 35 to firmly adherent portions 1014b of conductors 1014. Module 2014 is typically attached to firmly adherent portions 1014b of conductors 1014 because in some cases it is sufficiently heavy such that if attached to portions 1014a it could endanger the integrity of portions 1014b of conductors 1014 and cause same to crack and/or break.

In a typical embodiment the module 2012 comprises an integrated circuit formed in a silicon chip of the flip chip or surface mount type, suitably covered by an insulating material (not shown) and having a plurality of external contacts 3012 (e.g., silver bumps) on the lower surface 3412 thereof. These contacts 3012 are connected to electrodes (not shown) of various circuit elements (not shown) of the module 2012. The electrical module 2012 may take various other forms as previously mentioned. It is to be noted that for illustrative purposes only one module 2012 is shown. Typically a printed circuit board assembly 1012 contains a plurality of modules 2012 and 2014 of different types. It may, however, contain just one or more of modules 2012.

The conductive pattern formed by the conductors 1014 and the modules 2012 and 2014 form an electrical circuit of the printed circuit board assembly 1012. The conductors 1014 are typically formed by depositing a patterned layer of a suitable ink or paste that, after firing, provides a conductive pattern. Such conductors may include copper, nickel, silver, palladium, platinum and gold and/or alloys thereof and/or other suitable metals and/or compounds to make them conductive.

In a preferred embodiment, the conductive layer was formed by the use of Dupont 9161, previously described, which comprises essentially finely divided copper particles, a screening agent and adhesion promoters.

Each contact 3012 of module 2012 is typically connected to one part of a portion 1014a of a conductor 1014 by means of a bond, such as a solder joint 3212. All of the solder joint bonds 3212 and 35 between both modules 2012 and 2014 and the conductors 1014 could be formed in various other ways, including use of a conductive adhesive epoxy or other conductive adhesive material, or could be welds.

In accordance with the invention, the various materials involved are chosen such that mechanical stresses on the solder joints 3212 are significantly relieved by the ability of the solder joints 3212 to move relative to the circuit board 4012. The relative motion can be achieved in two basic fashions.

In the first, the portions 1014a of conductors 1014 remain intimately bonded (attached) to portions of the inhibitor layer 1016 therebelow and together they move along and/or lift off circuit board 4012. This approach has the potential of increasing the mechanical strength of the composite layer portions.

In the other approach, the portions of the inhibitor layer 1016 under portions 1014a of conductors 1014 remain in place intimately bonded to the circuit board 4012 while the portions 1014a of the conductors 1014 are free to move along or lift off the portions of inhibitor layer 1016.

A conductive layer printed on a circuit board depends for its adhesion to the circuit board on a reaction between the surface of the board and the ingredients in the composition (e.g., ink) used to print the conductive layer. For controlled adhesion of the kind desired, it is necessary to partially stifle this reaction so that the layer can separate from the circuit board in response to mechanical stress.

When the ink being used to print a conductive layer includes adhesion promoters that react and insure firm adhesion where applied directly to a substrate, such as the surface of a printed circuit board, an inhibitor layer must serve to restrain such reaction.

There are several possible approaches to providing such an inhibitor layer.

A first approach is to use an inhibitor layer that essentially includes only an organic vehicle that has poor burn-out characteristics under the firing conditions used, such as the case where a nitrogen atmosphere is used for firing a conductive layer (e.g., copper), so that little reaction is created with the substrate for promoting adhesion because excessive organics render the binders in the ink ineffective.

A second approach involves using as the inhibitor layer a film including essentially only an organic vehicle that has excellent burn-out to lessen a chance of reaction between the adhesive promoters and the substrate. This approach is suitable in cases where no residual organics on the substrate are tolerable.

A third approach is to form the inhibitor layer by a composition that consists essentially of a finely divided refractory material (e.g., alumina) suspended in an organic medium.

A fourth and presently preferred approach is to form the inhibitor layer by a composition that has a finely divided refractory material and a glass frit suspended in an organic medium. As mentioned earlier, the glass frit is chosen to soften and wet both the surface of the circuit board and the refractory material, typically alumina, at a temperature below the firing temperatures. This promotes bonding among the refractory particles and between the refractory particles and the surface of the circuit board. The refractory material, preferably an oxide such as alumina, should have negligible reaction with the conductive layer to be deposited over the inhibitor layer.

In a specific embodiment of the invention in accordance with the last approach, the inhibitor layer 1016 was formed by printing a composition comprising by weight essentially about 80 percent a screening agent, about 10 percent a glass frit and about 10 percent alumina ($Al_2O_3$). Moreover the glass frit consisted by weight essentially of about 66.6 percent lead oxide (PbO), 22.4 percent silicon dioxide ($SiO_2$), 8.7 percent boron trioxide ($B_2O_3$) and 2.3 percent alumina ($Al_2O_3$).

Other suitable compositions for use in printing the inhibitor layer 1016 included by weight: about 50 percent screening agent, 17 percent glass frit, and 33 percent alumina; and about 40 percent screening agent, about 20 percent glass frit and about 40 percent alumina.

In these compositions the screening agent used comprised by weight about 25 percent of a resin, typically Elvacite 2046, a product of E. I. Dupont de Nemours Inc. dissolved in a solvent, such as Texanol ™, a product that has been previously described, and the glass frit used comprised by weight between 60–75 percent PbO, 10–25 percent $SiO_2$, 5–30 percent $B_2O_3$ and 0–10 percent $Al_2O_3$. Various glass frit compositions other than the specific composition described can be used consistent with the requirements mentioned above. Alternatively, certain oxides, such as bismuth oxide ($Bi_2O_3$), which serve essentially the same function as the glass frit, can be substituted for the glass frit. These certain oxides are denoted as "oxide binders".

The thickness of the inhibitor layer 1016 is desirably as thin as can be printed reliably to minimize topographical changes in the conductors. The surface area of the inhibitor layer 1016 is sufficient to encompass the regions desired for controlled adhesion but need not necessarily be patterned to be congruent in width and length with the conductive layer. The thickness of the inhibitor layer 1016 is typically in the range of 0.0001 to 0.001 inches with a preferred range of 0.0002 to 0.0005 inches. A blanket inhibitor layer could be used instead of separated inhibitor layers for each portion of the conductors which are to be characterized by controlled adhesion. The thickness of the conductors 1014 is typically in the range of 0.0003 to 0.001 inches with a preferred range of 0.0004 to 0.0008 inches. Generally, the thickness of the inhibitor layer after firing can be controlled both by the thickness of the layer printed and the percentage of the inorganic solids (the glass frit and the refractory materials) in the composition printed. Generally, such solids should be between 5 and 85 percent by weight of the composition. The degree of adhesion is determined primarily by the ratio of the amount of glass frit and the amount of refractory materials in the composition. This ratio most advantageously is in the range between 0.1 and 2.0.

The printed patterns can be formed in two basic ways.

The presently preferred way is first to print the composition that provides the inhibitor layer and merely to dry this layer without firing. Then there is printed and dried the composition that provides the conductive layer. The resultant is then heated for firing both layers in the same heating cycle. The heating cycle used is that recommended by the manufacturer for Dupont 9161 composition and basically is that previously discussed with reference to FIG. 10.

Alternatively, depending on the nature of the selected conductor and inhibitor, the first layer could be both dried and fired before deposition of the second layer.

Examples of refractory oxides that can be used instead of $Al_2O_3$ are $SiO_2$, $ZrO_2$ and $TiO_2$. A combination of any of these four refractory oxides could also be used.

As mentioned previously, other refractory materials, such as nitrides, should be useful in place of the refractory oxides if compatible with the glass frit.

Various other compositions for both the inhibitor layer and the conductive layer can be expected to be useful, consistent with the principles set forth including particularly various other screening agents and amounts of screening agents.

Moreover, the principles of controlled adhesion that have been discussed above in the context of electrical application to printed circuit board technology are not limited to such application. The principles can be extended to applications in which the controllably adherent conductors serve primarily mechanical rather than primarily electrical roles. The principles can be further extended to applications in which non-electrically conductive members (runners), which have essentially the same controlled adhesion as the controllably adherent conductors, are used in mechanical roles.

It is to be appreciated that the specific embodiments described are merely illustrative of the general principles of the invention. Various modifications may be provided consistent with the principles set forth.

We claim:

1. A printed circuit board assembly comprising:
   a printed circuit board having a top surface;
   an inhibitor layer having portions printed in intimate contact with said top surface;
   a conductive layer having first portions printed in intimate contact with said top surface for forming thereon firmly adherent conductor regions and having second portions printed over the inhibitor layer portions for forming controllably adherent conductor regions;
   at least one electrical module having contacts by which said electrical module is connected to the controllably adherent connector regions wherein the inhibitor layer is formed from a composition including a screening agent, a refractory material and a glass frit.

2. The printed circuit board assembly of claim 1 in which the refractory material is an oxide.

3. The printed circuit board assembly of claim 2 in which the refractory oxide is one of or a combination of $Al_2O_3$, $SiO_2$, $ZrO_2$ and $TiO_2$.

4. The printed circuit board assembly of claim 2 in which by weight the composition is essentially about 10 percent glass frit, 10 percent alumina and the remainder the screening agent.

5. The printed circuit board assembly of claim 2 in which by weight the composition is essentially about 17 percent glass frit, 33 percent alumina and the remainder screening agent.

6. The printed circuit board assembly of claim 2 in which by weight the composition is essentially about 20 percent glass frit, 40 percent alumina and the remainder screening agent.

7. The printed circuit board assembly of claim 1 in which the ratio by weight of the glass frit to the refractory material is between 0.1 and 2.0.

8. The printed circuit board assembly of claim 7 in which the refractory material is alumina.

9. The printed circuit board assembly of claim 1 in which the weight of the glass frit and the refractory material is between 5 and 85 percent of the weight of the composition.

10. The printed circuit board assembly of claim 9 wherein the inhibitor layer has a thickness in the range of 0.0002 to 0.0005 inches.

11. The printed circuit board assembly of claim 1 in which the glass frit comprises a combination of oxides taken from the group consisting of $PbO$, $SiO_2$, $B_2O_3$, and $Al_2O_3$.

12. The printed circuit board assembly of claim 11 in which the glass frit by weight essentially comprises 60–75 percent $PbO$, 10–25 percent $SiO_2$, 5–30 percent $B_2O_3$ and 0–10 percent $Al_2O_3$.

13. The printed circuit board assembly of claim 11 in which by weight the glass frit is about 66.6 percent $PbO$, 22.4 percent $SiO_2$, 8.7 percent $B_2O_3$ and 2.3 percent $Al_2O_3$.

14. The printed circuit board assembly of claim 13 in which by weight the composition is essentially about 10 percent glass frit, 10 percent alumina and the remainder the screening agent.

15. The printed circuit board assembly of claim 13 in which by weight the composition is essentially about 17 percent glass frit, 33 percent alumina and the remainder screening agent.

16. The printed circuit board assembly of claim 13 in which the composition by weight is about 20 percent glass frit, 40 percent alumina and the remainder screening agent.

17. The printed circuit board assembly of claim 3 wherein the inhibitor layer has a thickness in the range of 0.0001 to 0.001 inches.

18. The printed circuit board assembly of claim 1 in which the inhibitor layer is between 0.0002 inch and 0.0005 inch thick.

19. The printed circuit board assembly of claim 18 in which the conductive layer is a metal taken from the group consisting of copper, nickel, silver, palladium, platinum and gold and/or alloys thereof.

20. The printed circuit board assembly of claim 18 in which the printed circuit board is of alumina and the conductive layer is of copper of a thickness between 0.0003 inch and 0.001 inch.

21. A method of forming a printed circuit board assembly comprising the steps of:
  printing and drying on a circuit board a patterned layer of a first composition;
  printing and drying on the circuit board a patterned layer of a second composition including portions overlying portions of said layer of first composition;
  firing the two layers for forming on the circuit board a first pattern of firmly adherent conductors from said layer of the second composition in intimate contact with said circuit board and a second pattern of controllably adherent conductors where portions of the layer of the second composition overlie portions of the layer of the first composition; and
  connecting at least one electrical module to said second pattern of controllably adherent conductors, and connecting at least one other electrical module having contacts by which said other electrical module is connected to the firmly adherent conductor.

22. The method of claim 21 in which the layer of first composition comprises essentially a screening agent, glass frit and alumina, nd the second composition comprises essentially a screening agent, a metallic powder and adhesion promotors.

23. The method of claim 22 in which the ratio by weight of the glass frit to the alumina in the first composition is between 0.1 and 2.0.

24. The method of claim 23 in which the glass frit and the alumina form by weight between 5 and 85 percent of the first composition.

25. The method of claim 22 in which the glass frit in the first composition comprises PbO, $SiO_2$, $B_2O_3$ and $Al_2O_3$.

26. The method of claim 25 in which the glass frit by weight essentially comprises 60-75 percent PbO, 10-25 percent $SiO_2$, 5-30 percent $B_2O_3$ and 2-10 percent $Al_2O_3$.

27. The method of claim 26 in which the metal powder in the second composition is copper powder.

28. The method of claim 26 in which by weight the first composition is about 10 percent glass frit, 10 percent alumina and the remainder screening agent.

29. The method of claim 26 in which by weight the first composition is about 17 percent glass frit, 33 percent alumina and the remainder screening agent.

30. The method of claim 26 in which by weight the first composition is about 20 percent glass frit, 40 percent alumina and the remainder screening agent.

31. A composition for use as an inhibitor layer on a circuit board comprising a screening agent, at least one finely divided refractory oxide taken from the group consisting of $Al_2O_3$, $SiO_2$, $ZrO_2$, and $TiO_2$ and a glass frit consisting of a mixture taken from the group consisting of PbO, $SiO_2$, $B_2O_3$ and $Al_2O_3$, and the ratio by weight of the glass frit to the refractory oxide is between 0.1 and 2.0, and the glass frit and the refractory oxide form by weight between 5 and 85 percent of the composition.

32. The composition of claim 31 in which the glass frit comprises by weight 60-75 percent PbO, 10-25 percent $SiO_2$, 5-10 percent $B_2O_3$ and 0-10 percent $Al_2O_3$.

33. The composition of claim 32 in which the finely divided refractory oxide is alumina.

34. A printed circuit board assembly comprising:
  a printed circuit board having a top surface;
  an inhibitor layer having portions printed in intimate contact with said top surface;
  a conductive layer having first portions printed in intimate contact with said top surface for forming thereon firmly adherent conductor regions and having second portions printed over the inhibitor layer portions for forming controllably adherent conductor regions;
  at least one electrical module having contacts by which said electrical module is connected to the controllably adherent conductor regions; and
  said printed circuit board being constructed and arranged so that during operation said second portion of said conductive layer overlying the inhibitor layer is capable of separating from and lifting off said inhibitor layer.

35. A printed circuit board assembly comprising:
  a printed circuit board having a top surface;
  an inhibitor layer having portions printed in intimate contact with said top surface;
  a conductive layer having first portions printed in intimate contact with said top surface for forming thereon firmly adherent conductor regions and having second portions printed over the inhibitor layer portions for forming controllably adherent conductor regions;
  at least one electrical module having contacts by which said electrical module is connected to the controllably adherent conductor regions; and
  said printed circuit board being constructed and arranged so that during operation both the inhibitor layer and the conductive layer overlapping said inhibitor layer are capable of separating from and lifting off of said printed circuit board top surface.

36. A method of forming a printed circuit assembly board comprising the steps of:
  forming on a circuit board a printed pattern of inhibitor regions;
  forming on said printed circuit board a printed pattern of conductive regions, including portions overlying said inhibitor regions to form controllably adherent conductor regions;
  connecting to said controllably adherent conductor regions at least one electrical module; and
  constructing and arranging said controllably adherent conductor regions so that during operation of said assembly said conductive region overlying said inhibitor region is capable of separating from and lifting off said inhibitor region.

37. A method of forming a printed circuit assembly board comprising the steps of:

forming on a circuit board a printed pattern of inhibitor regions;

forming on said printed circuit board a printed pattern of conductive regions, including portions overlying said inhibitor regions to form controllably adherent conductor/inhibitor regions;

connecting to said controllably adherent conductor/inhibitor region at east one electrical module; and constructing and arranging said controllably adherent conductor/inhibitor region so that said conductor/inhibitor region is capable of separating from and lifting off said circuit board in response to mechanical stresses during operation of said circuit board.

38. A method of forming a printed circuit board assembly comprising the steps of:

printing and drying on a circuit board a patterned layer of a first composition;

printing and drying on the circuit board a patterned layer of a second composition including portions overlying portions of said layer of first compositions;

firing the two layers for forming on the circuit board a first pattern of firmly adherent conductors from said layer of the second composition in intimate contact with said circuit board and a second pattern of controllably adherent conductors where portions of the layer of the second composition overlying portions of the layer of the first composition;

connecting at least one electrical module to said second pattern of controllably adherent conductors; and constructing and arranging said printed circuit board so that said layer of the second composition overlying portions of the first layer of composition is capable of separating from and lifting off said first layer in response to mechanical stress during the operation of said printed circuit board.

39. A method of forming a printed circuit board assembly comprising the steps of:

printing and drying on a circuit board a patterned layer of a first composition;

printing and drying on the circuit board a patterned layer of a second composition including portions overlying portions of said layer of the first composition;

firing the two layers for forming on the circuit board a first pattern of firmly adherent conductors from said layer of the second composition in intimate contact with said circuit board and a second pattern of controllably adherent conductors where portions of the layer of the second composition overly portions of the layer of the first composition;

connecting at least one electrical module to said second pattern of controllably adherent conductors; and constructing and arranging said printed board so that both layers of the second pattern of controllably adherent conductors is capable of separating from and lifting off said circuit board in response to mechanical stress during the operation of said circuit board.

40. A method of forming a printed circuit board assembly comprising the step of:

printing and drying on a circuit board a patterned layer of a first composition;

printing and drying on the circuit board patterned layer of a second composition including portions overlying portions of said layer of first composition;

firing the two layers for forming on the circuit board a first pattern of firmly adherent conductors from said layer of the second composition in intimate contact with said circuit board and a second pattern of controllably adherent conductors where portion of the layer of the second composition overlie portions of the layer of the first composition;

connecting at least one electrical module to said second pattern of controllably adherent conductors, and wherein said first composition comprises a screening agent, a refractory material and a glass frit.

* * * * *